United States Patent
Kobayashi et al.

(10) Patent No.: US 6,297,656 B1
(45) Date of Patent: Oct. 2, 2001

(54) PROBE-TEST METHOD AND PROBER

(75) Inventors: Masahito Kobayashi, Yamanashi-ken; Kazunari Ishii, Kofu, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/110,073

(22) Filed: Jul. 2, 1998

(30) Foreign Application Priority Data

Jul. 11, 1997 (JP) .................................................. 9-202476

(51) Int. Cl.⁷ ........................................................ G01R 1/04
(52) U.S. Cl. ........................ 324/758; 324/158.1; 324/760
(58) Field of Search ................................ 324/158.1, 758, 324/760, 759, 757

(56) References Cited

U.S. PATENT DOCUMENTS

| | | | |
|---|---|---|---|
| 4,934,064 | * 6/1990 | Yamaguchi et al. | 324/158.1 |
| 5,410,259 | * 4/1995 | Fujihara et al. | 324/758 |
| 5,436,571 | * 7/1995 | Karasawa | 324/765 |
| 5,773,987 | * 6/1998 | Montoya | 324/757 |
| 5,777,485 | * 7/1998 | Tanaka et al. | 324/757 |
| 5,872,458 | * 2/1999 | Boardman et al. | 324/758 |
| 6,037,793 | * 3/2000 | Miyazawa et al. | 324/760 |

FOREIGN PATENT DOCUMENTS

| | | |
|---|---|---|
| 63-108738 | 5/1988 | (JP) . |
| 5-273237 | 10/1993 | (JP) . |

* cited by examiner

*Primary Examiner*—Safet Metjahic
*Assistant Examiner*—Jimmy Nguyen
(74) *Attorney, Agent, or Firm*—Oblon, Spivak, McClelland, Maier & Neustadt, P.C.

(57) ABSTRACT

With a probe-test method and a prober for examining certain electric characteristics of an object of examination, a main chuck is adapted to be driven to move in the X-, Y-, Z- and θ-directions in order to bring the object into contact with the probes of the prober and then the shaft of the support of the main chuck is warped under the contact pressure applied by the probes to tilt the main chuck. The position where each of the probes contacts the corresponding one of the electrodes on the object is displaced (moved) in the X-, Y- and Z-directions by the tilt. The displacement is predicted by an operation. unit and the main chuck is moved in the X-, Y- and Z-directions to correct the displacement.

12 Claims, 7 Drawing Sheets

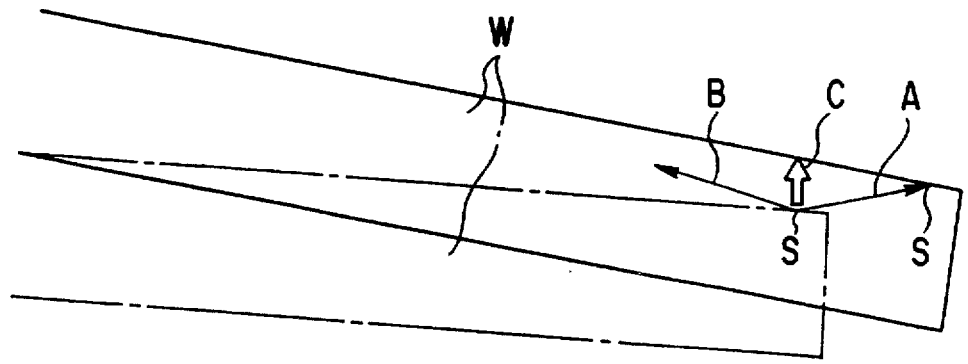
F I G. 2
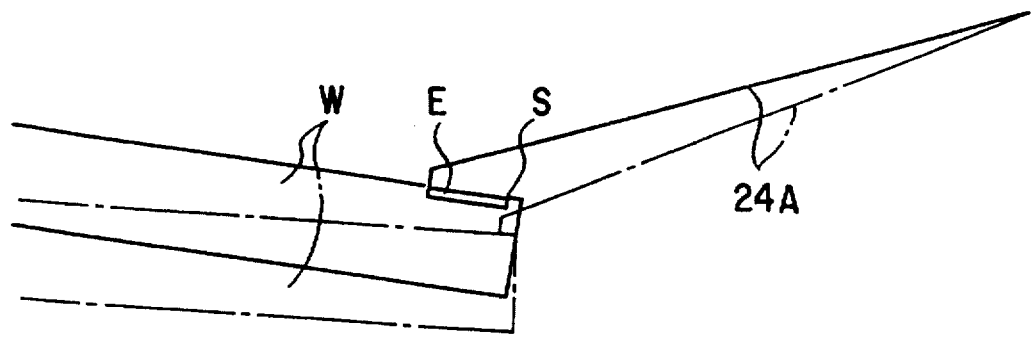
F I G. 3A
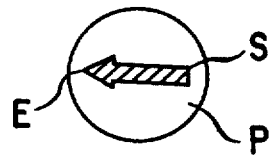
F I G. 3B

PROBE-TEST METHOD AND PROBER

BACKGROUND OF THE INVENTION

This invention relates to a probe-test method and also to a prober.

More particularly, the present invention relates to a probe-test method for determining certain electric characteristics of an object of examination and also to a prober to be used for such a test. While a prober for determining certain electric characteristics of integrated circuits (hereinafter referred to as IC chips) that are arranged on a semiconductor wafer (hereinafter referred to simply as wafer) may represent a typical and specific application of the present invention, the present invention is not limited thereto and a prober according to the invention may find applications in examining various electronic elements and devices for certain electric characteristics by means of a probe.

FIG. 6 of the accompanying drawings schematically illustrates known prober to be used for examining IC chips.

The prober 10 comprises a loader chamber 11 from which wafers contained in respective cassettes are taken out one by one and transferred, a prober chamber 12 for examining the wafers W transferred from the loader chamber 11, a controller 13 for controlling the prober chamber 12 and the loader chamber 11 and a display unit 14 that also operates as a control panel for driving the controller 13.

In the loader chamber 11, a fork 15 is rotatably fitted to a rotary shaft for transferring a wafer W from the inside of a cassette C. The fork 15 is horizontally extensible/retractable and also rotatable to face oppositely in order to take out wafers W in the cassette C on a one by one basis and transfer them to the prober chamber 12. A sub-chuck 16 is arranged near the fork 15 for pre-aligning wafers W. More specifically, the sub-chuck receives a wafer W from the fork 15, rotates it in the sense of θ in order to make it face oppositely and then pre-align the wafer W by referring to its orientation flat.

In the prober chamber 12, there are provided a main chuck 17 for carrying a wafer w therein, an aligning means 20 and a probe card. The main chuck 17 is adapted to be driven in the X- and Y-directions of the prober by means of X- and Y-stages 18 and 19 and also in the Z- and θ-directions by means of a built-in drive mechanism.

The aligning means 20 comprises an alignment bridge having a first image pick-up means (e.g., a CCD camera) 21 for shooting the wafer W in position to pick up an image thereof, a pair of guide rails 23, 23 for reciprocating the alignment bridge 22 along the Y-direction and a second image pick-up means (not shown, e.g, a CCD camera) fitted to the main chuck 17.

A tester head (not shown) is arranged on the upper surface of the probe card and connected thereto by means of a connection ring (not shown). A test signal transmitted from the tester that comprises the prober is sent to electrodes of the IC chip being examined by way of the tester head, the connection ring and the probes of the probe card and the output signal of the IC chip representing the test result is sent back to the tester by way of the same signal route. The tester is adapted to determine certain electric characteristics of the IC chip on the basis of the signal representing the test result.

For testing a wafer W, the fork 15 takes a wafer W out of the cassette C in the loader chamber 11. The wafer W is then pre-aligned by the sub-chuck 16 on its way of being transferred to the prober chamber 12 and moved onto the main chuck 17 in the prober chamber 12. Then, the alignment bridge 22 moves over the main chuck 17 until the wafer W is placed to a position right below the first image pick-up means 21 of the alignment bridge 22, where the first image pick-up means 21 and the second image pick-up means of the main chuck 17 cooperate for the alignment of the wafer W on the main chuck 17. The main chuck 17 is adapted to move in the X- and Y-directions for indexing the wafer W for each test and then move upward in the Z-direction until the wafer W comes into physical contact with the probes. Then, the main chuck 17 is driven upward excessively further in the Z-direction to make the electrode pads of the IC chip on the wafer W electrically contact with the probes in order to determine certain electric characteristics of the IC chip. Note that, if the wafer W has a size not greater than 8 inches, the wafer W is held substantially horizontal as shown in FIG. 7A when the main chuck 17 is driven upward excessively and the wafer W on the main chuck 17 is raised to the position indicated by a solid line from the position indicated by a broken line in FIG. 7A. Consequently, each of the probes 24A of the probe card 24 is resiliently moved up from the position indicated by a broken line to the position indicated by a solid line in FIG. 7A so that the tip of each of the probes moves from the starting point S to the terminal point E on the thick line in FIG. 7A. FIG. 7B shows the apparent horizontal movement of the tip from the starting point S to the terminal point E on the surface of the wafer W. However, since the tip of the probe is located within an electrode pad P of the IC chip, the probe 24A is held in electric contact with the electrode pad P. If, on the other hand, the wafer W has a larger size of, for example, 12 inches, the IC chip will have to be ultra-micro-machined and the electrode pads will probably be arranged at a smaller pitch. Then, the probe card will be provided with a correspondingly increased number of probes, which may be as many as 2,000. So, the load of all the probes 24A to be borne by the main chuck 17 will be very heavy and found somewhere between 10 kg and 20 kg. Then, as the wafer W is excessively raised from the position indicated by a broken line to the position indicated by a solid line in FIG. 8A, the shaft of the support (not shown) of the main chuck 17 will be bent and the wafer W will be tilted by, e.g., 20 to 30 μm and moved outwardly to the position shown by solid lines in FIG. 8A. Consequently, each of the probes 24A of the probe card 24 is resiliently moved up from the position indicated by a broken line to the position indicated by a solid line in FIG. 8A so that the tip of each of the probes travels from the starting point S to the terminal point E on the thick line in FIG. 8A by a distance greater than its counterpart in FIG. 7A (as indicated by the arrow in FIG. 8B). Therefore, if the starting point S of the tip of the probe in FIG. 8A is identical with that of the probe in FIG. 7A, the terminal point E can be located out of the electrode pad P as shown in FIG. 8B. Then, no test signal will be transmitted from the probe 24A to the electrode pad P to damage the reliability of the test.

BRIEF SUMMARY OF THE INVENTION

It is therefore the object of the invention to solve the above identified technical problem.

More specifically, an object of the present invention is to provide a probe-test method and a prober with which each probe can reliably contact with the corresponding one of the electrodes of the object of examination to ensure a test to be performed highly reliably.

As pointed out above, as the main chuck carrying thereon an object of examination is raised toward probes to bring the object into contact with the probes, the main chuck can be tilted under the pressure applied by the probes, which by turn displaces the contact point of each of the probes and the corresponding one of the electrodes of the object of examination. Thus, another object of the present invention is to provide a probe-test method and a prober that can predict and correct the displacement on the basis of various data so that each of the probes can reliably contact with the corresponding one of the electrodes of the object of examination to ensure a test to be performed highly reliably.

Still another object of the present invention is to provide a probe-test method and a prober that can reliably and excessively drive the main chuck in the X-, Y- and Z-directions of the prober.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

According to a first aspect of the invention, there is provided a probe-test method characterized by comprising steps of:

placing an object of examination on a main chuck adapted to move along X-, Y-, Z- and θ-directions;

aligning the main chuck with probes held to respective locations above the main chuck;

raising the main chuck toward the probes to make the object of examination contact with the probes; and examining the object of examination to determine certain electric characteristics thereof; characterized in that the step of raising the main chuck toward the probes to make the object of examination contact with the probes comprises steps of:

predicting the displacement of each of the positions on the object of examination to be brought into contact with the corresponding one of the probes in the X-, Y- and Z-directions due to the tilt of the main chuck caused by the contact of the object of examination on the main chuck with the probes on the basis of given data;

determining by arithmetic operation the distance for the position to be corrected at least in one of the X-, Y- and Z-directions in order to reduce the predicted displacement; and determining the position for the main chuck to be raised to according to the distance of correction.

According to a second aspect of the invention, a probe-test method according to the first aspect of the invention is characterized by further comprising a step of:

determining the feasibility of at least one of the displacement and the distance of correction.

According to a third aspect of the invention, a probe-test method according to the first aspect of the invention is characterized in that the given data comprises data relating to the main chuck, those relating to the object of examination and those relating to the probes.

According to a fourth aspect of the invention, there is provided a probe-test method characterized by comprising steps of:

placing an object of examination on a main chuck adapted to move along X-, Y-, Z- and θ-directions;

aligning the main chuck with probes held to respective locations above the main chuck;

raising the main chuck toward the probes to make the object contact with the probes; and examining the object of examination to determine certain electric characteristics thereof; characterized in that the step of raising the main chuck toward the probes to make the main chuck contact with the probes comprises steps of:

predicting the displacement of each of the positions on the main chuck to be brought into contact with the corresponding one of the probes in the X-, Y- and Z-directions due to the tilt of the main chuck caused by the contact of the object of examination on the main chuck with the probes on the basis of given data;

determining by arithmetic operation the distance for the position to be corrected at least in one of the X-, Y- and Z-directions in order to reduce the predicted displacement;

determining the position for the main chuck to be raised to according to the distance of correction; and raising the main chuck to the determined position in a plurality of raising steps.

According to a fifth aspect of the invention, a probe-test method according to the fourth aspect of the invention is characterized by further comprising a step of:

determining the feasibility of at least one of the displacement and the distance of correction.

According to a sixth aspect of the invention, a probe-test method according to the fourth aspect of the invention is characterized in that the main chuck is raised in each of the X-, Y- and Z-direction, at least in one step.

According to a seventh aspect of the invention, there is provided a prober characterized by comprising:

a prober chamber;

a plurality of probes rigidly held to an upper portion of the prober chamber;

a main chuck arranged below the probes for carrying thereon an object of examination movable in X-, Y-, Z- and θ-directions; and a controller for controlling the movement of the main chuck to align the probes and the object of examination and raise the object of examination in order to make it contact with the probes;

characterized in that the controller comprises a system adapted to raise the main chuck in order to make the object of examination contact with the probes by:

predicting the displacement of each of the positions on the object of examination to be brought into contact with the corresponding one of the probes in the X-, Y- and Z-directions due to the tilt of the main chuck caused by the contact of the object of examination on the main chuck with the probes on the basis of given data;

determining by arithmetic operation the distance for the position to be corrected at least in one of the X-, Y- and Z-directions in order to reduce the predicted displacement; and determining the position for the main chuck to be raised to according to the distance of correction.

According to an eighth aspect of the invention, a prober according to the seventh aspect of the invention is characterized in that the system comprises:

a memory for storing data relating to the main chuck, those relating to the object of examination and those relating to the probes;

a first operation unit for arithmetically determining the displacement according to the data stored in the memory;

a second operation unit for arithmetically determining the distance for the position to be corrected at least in one of the X-, Y- and Z-directions in order to reduce the displacement according to the outcome of the operation of the first operation unit; and a determining unit for determining the feasibility of at least one of the outcome of the arithmetic operation of the first operation unit or that of the second operation unit.

According to a ninth aspect of the invention, a prober according to the seventh aspect of the invention is characterized in that the controller comprises:

a determining unit for determining the feasibility of at least one of the outcome of the arithmetic operation of the first operation unit and that of the second operation unit.

According to a tenth aspect of the invention, there is provided a prober comprising:

a prober chamber;

a plurality of probes held to an upper portion of the prober chamber;

a main chuck arranged below the probes for carrying thereon an object of examination movable in X-, Y-, Z- and θ-directions of the prober; and a controller for controlling the movement of the main chuck to align the probes and the object of examination and raise the object of examination in order to make it contact with the probes;

characterized in that the controller comprises a system adapted to raise the main chuck in order to make the object of examination contact with the probes by:

predicting the displacement of each of the positions on the object of examination to be brought into contact with the corresponding one of the probes in the X-, Y- and Z-directions due to the tilt of the main chuck caused by the contact of the object of examination on the main chuck with the probes on the basis of given data;

determining by arithmetic operation the distance for the position to be corrected at least in one of the X-, Y- and Z-directions in order to reduce the predicted displacement;

determining the position for the main chuck to be raised to according to the distance of correction; and raising the main chuck to the determined position in a plurality of raising steps.

According to an eleventh aspect of the invention, a prober according to the tenth aspect of the invention is characterized in that the main chuck is raised in each of the X-, Y- and Z-direction, at least in one step.

A prober according to a twelfth aspect of the invention is characterized in that the controller comprises:

a memory for storing data relating to the main chuck, those relating to the object of examination and those relating to the probes;

a first operation unit for arithmetically determining the displacement according to the data stored in the memory;

a second operation unit for arithmetically determining the distance for the position to be corrected at least in one of the X-, Y- and Z-directions in order to reduce the displacement according to the outcome of the operation of the first operation unit; and a determining unit for determining the feasibility of at least one of the outcome of the arithmetic operation of the first operation unit and that of the second operation unit.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

FIG. 2 is an enlarged schematic partial side view of the main chuck of a prober according to the invention, illustrating how the amount of correction is determined by the controller of the prober.

FIG. 3A is an enlarged schematic partial side view of the main chuck of a prober according to the invention, illustrating the positional relationship between the main chuck and one of the probes of the prober.

FIG. 3B is a schematic plan view of an electrode pad of a wafer W placed in the prober of FIG. 3A, illustrating how the corresponding probe is moved.

DETAILED DESCRIPTION OF THE INVENTION

Figure 1:
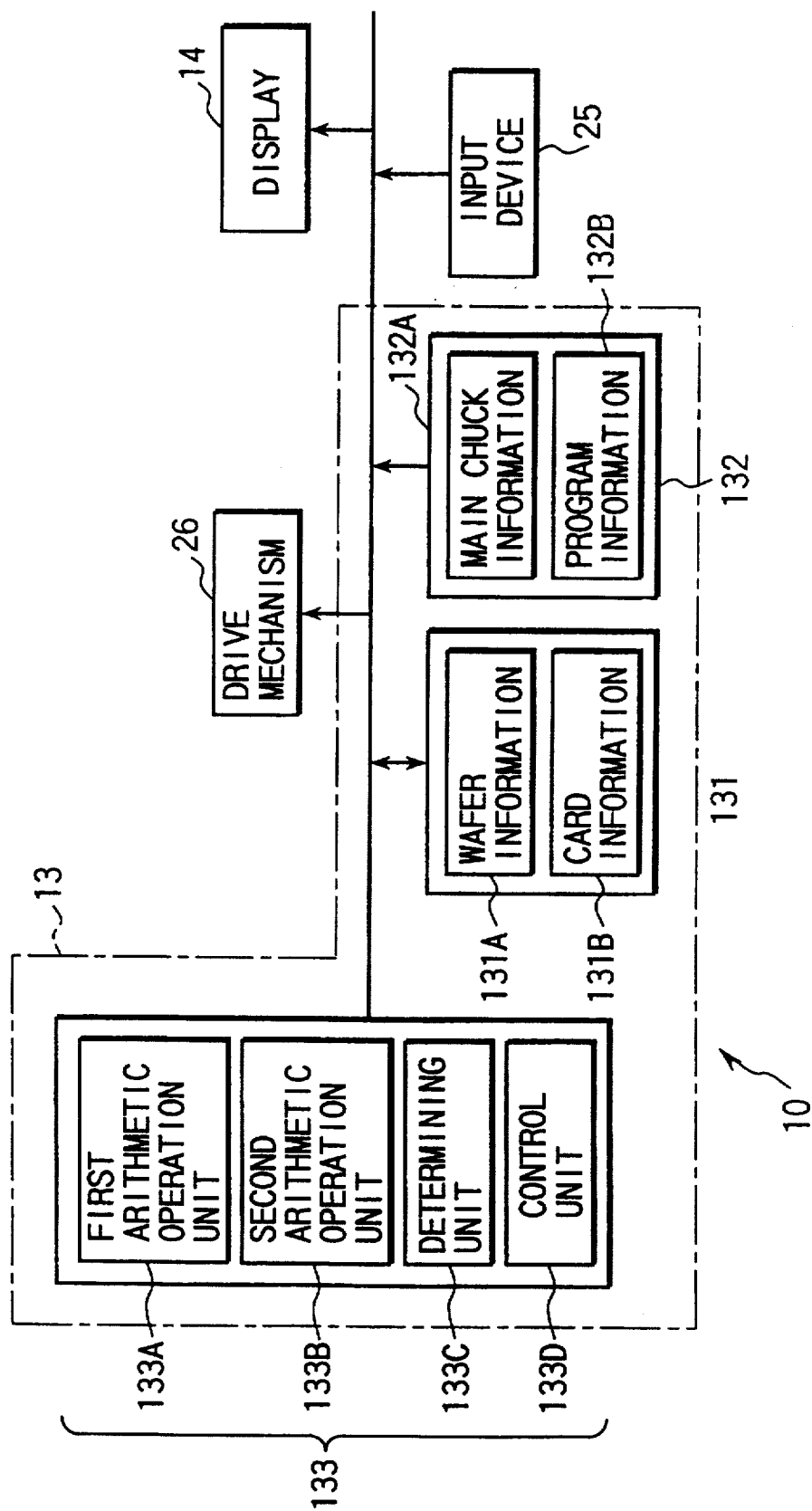
FIG. 1 is schematic block diagram of the controller of a prober according to the invention.

Now, the invention will be described in greater detail by referring to FIGS. 1 through 5 of the accompanying drawing that illustrate a preferred embodiment of prober according to the invention. Note that, throughout the drawing, same or similar components will be denoted respectively by same reference symbols. The illustrated embodiment of prober according to the invention is configured the same as the known prober in FIG. 6 except the controller 13. The embodiment comprises a loader chamber 11 and a prober chamber 12. The loader chamber 11 contains therein a fork 15 and a sub-chuck 16. The wafers W contained in cassette C are taken out and transferred by the fork 15 on a one by one basis. The prober chamber 16 contains therein a main chuck 17 adapted to be driven in the Z- and θ-directions of the prober, an X-stage 18, a Y-stage 19 and an aligning unit 20. The main chuck is adapted to be driven in the X-, Y-, Z- and θ-directions under the control of the controller 13 and cooperate with the aligning unit 20 to align the wafer W on the main chuck 17 with the probes (not shown) before it is driven upward toward the probes until the object of examination on it is brought into contact with the probes. The step of bringing the object of examination into contact with the probes may be divided into a sub-step of raising the main chuck until the object of examination on it comes into contact with or very close to the probes and that of driving the main chuck further upward excessively. As the probes come into electric contact with the electrodes of the IC chip formed on the wafer W, the object of examination is examined for certain electric characteristics.

As the main chuck is driven toward the probes excessively (i.e. over-driven), the object of examination placed on the main chuck contacts with the probes and the main chuck is partly subjected to the contact pressured applied by the probes. Then, the shaft of the support of the main chuck is bent to make the main chuck tilt. As a result of the tilt, the position at which each of the probes contacts the main chuck will be displaced in the X-, Y- and Z-directions. The controller 13 of this embodiment predicts the displacement and comprises memories for storing various data necessary for correcting the displacement. As shown in FIG. 1, data including parameters relating to the wafer W (hereinafter referred to as "wafer information") and those relating to the probe card 24 (hereinafter referred to as "probe card information") are stored in a first memory 131 (e.g., a RAM). The program for controlling the prober and data including parameters relating to the main chuck 17 (hereinafter referred to as "main chuck information") are stored in a second memory 132 (e.g., a ROM). A central processing unit (hereinafter referred to as "CPU") 133 performs predetermined processing operations on the information stored in the first memory 131 and the second memory 132 and issues command signals reflecting the results of the operations respectively.

The first memory 131 includes a wafer information memory section 131A for storing wafer information and a card information memory section 131B for storing card information. The second memory 132 includes a main chuck information memory section 132A for storing main chuck information and a program memory section 132B for storing programs relating to the probing method and the control program. The CPU 133 includes a first arithmetic operation unit 133A for determining the distance of correction for each IC chip in terms of the X-, Y- and Z-directions of the prober on the basis of the main chuck information, wafer information and the card information stored in the first memory 131 when the main chuck is driven excessively, a second arithmetic operation unit 133B for determining the distance driven excessively on the basis of the outcome of the operation of the first arithmetic operation unit 133A, a determining unit 133C for determining the feasibility of the distance driven excessively and a control unit 133D. The first and second arithmetic operation units 133A, 133B and the determining unit 133C operates under the control of the control unit 133D.

Said distance of correction can be determined from the distances for which the position, at which each probe is to contact the main chuck, is displaced in the X-, Y- and Z-directions when the main chuck is driven excessively and subsequently titled, so that the distance may become the shortest possible.

As shown in FIG. 1, said controller 13 is connected to an input device 25 (e.g., keyboard) and a display 14. Various data required for the various examination (e.g., wafer information, card information, main chuck information) are entered from the input device 25 to the controller 13. The entered data can be visually confirmed on screen of the display 14. The controller 13 is connected to a drive mechanism 26 for driving the main chuck 17. The drive mechanism 26 is used to drive not only the main chuck 17 but also an aligner 20 and other relevant units of the prober.

The wafer information includes data on the location of each of the IC chips, the size of the chip, the position of the center of gravity of the chip, the number of electrode pads, the area of the electrode pads, the pitch of arrangement of the electrode pads and other parameters. The card information includes data on the number of probes (pins), their respective locations, the material and the physical properties of the probes, the pressure being applied to them and other parameters. The main chuck information includes data on the mechanical strength of the rotary shaft of the main chuck 17, the outer diameter of the main chuck 17 and other parameters.

Now, a preferred mode of carrying out a probe-test method according to the invention will be described by referring to FIGS. 2 and 3.

For a probing operation, the main chuck 17 is raised in the Z-direction and wafer W to be examined contacts or comes close to the corresponding one of the probes 24A at the position indicated by broken lines in FIGS. 2 and 3. Subsequently, the wafer W is driven excessively upward from the position indicated by broken lines and subjected to a contact pressure applied to it by the probe 24A. The contact pressure is a partial load applied onto part of the wafer W. The shaft of the support of the main chuck 17 is tilted by the partial load so that the wafer W is inclined outwardly from its horizontal position as shown by solid lines in FIG. 2. Then, the tip of the probe 24A is displaced (moved) from the starting point S in the direction as indicated by arrow A in FIG. 2.

According to the invention, the controller 13 calculates the distance of correction for the main chuck 17 to be moved for correction in terms of the X-, Y- and Z-directions of the probers. Consequently, the main chuck 17 carrying thereon the wafer W is moved by the calculated distance of correction in the direction indicated by arrow B in FIG. 2. As a result of the movement, the tips of the probes contacting the wafer W are raised vertically as indicated by arrow C as if the wafer W were raised horizontally. Thus, the tips of the probes follow the respective tracks as indicated by a thick line exemplarily shown in FIG. 3A that are substantially same as the tracks to be followed by the respective tips of the probes when the wafer W is raised horizontally. Then, as shown in FIG. 3B, the tip of each of the probes remains within the corresponding electrode pad P to ensure an electric contact between the probe 24A and the electrode pad P and hence an electric examination can be reliably performed on the IC chip.

Note that, in the operation of moving the main chuck 17 to correct the displacement, the main chuck 17 cannot be moved and stopped simultaneously in all the X-, Y- and Z-directions. This means that there are time lags among the starts of movement in the X-, Y- and Z-directions for the main chuck 17 and hence the main chuck 17 cannot move accurately following an ideal track. This is due to the difference, if slight, between the weights of that the X stage 18 and that of the Y stage 19, the difference among displacements of the probes relative to the IC chip and the difference among the resolving powers of displacement in the X-, Y- and Z-directions.

As the time lags among the starts of movement in the different directions increase, the main chuck 17 diverts from the ideal track to make it difficult to control the movement of the main chuck 17 accurately.

Figure 4A:
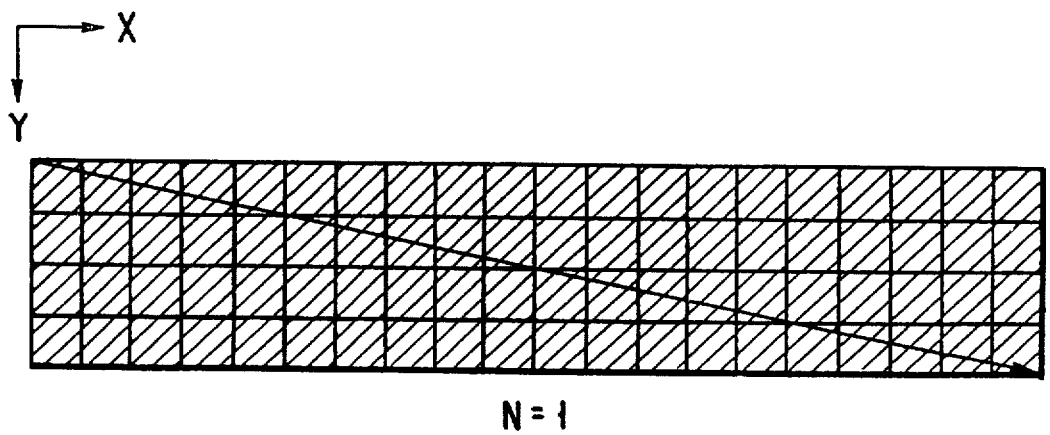
FIGS. 4A, 4B and 4C are graphs, each showing the relationship between an ideal track of the main chuck of a prober according to the invention and a track area covering a possible displacement from the ideal track.
Figure 4B:
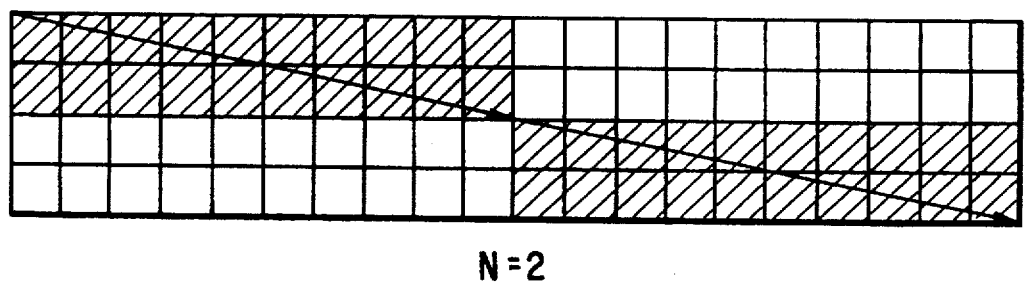
Figure 4C:
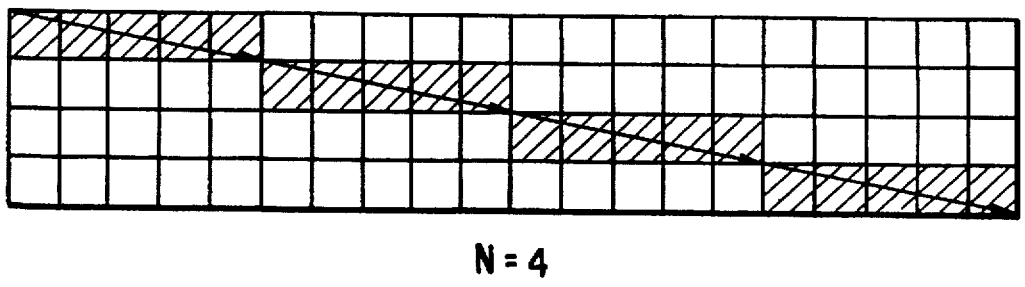

In order to control the movement of the main chuck 17 accurately according to the invention, the distance by which the main chuck 17 is driven excessively is divided into a plurality of (N) sections and the main chuck 17 is driven excessively stepwise on a stroke by stroke basis. Assume now the arrow shown FIG. 4A represents an ideal track to be followed by the main chuck 17 that is moved in the X- and Y-directions. If the main chuck 17 is driven from the starting point S to the terminal point E in a single stroke by the X stage 18 and the Y stage 19, the course the main chuck 17 can take is found within the shaded area in FIG. 4A. However, if the main chuck 17 is driven from the starting point S to the terminal point E in two strokes, the course the main chuck 17 can take is found within the shaded areas in FIG. 4B, the sum of which is equal to a half of the area of FIG. 4A. Furthermore, if the main chuck 17 is driven from the starting point S to the terminal point E in four strokes, the course the main chuck 17 can take is found within the shaded areas in FIG. 4C, the sum of which is equal to a half of the corresponding area of 4B.

Thus, while the main chuck 17 cannot be made to follow an ideal track in an operation of correcting the movement of the main chuck 17 in the X-, Y- and Z-directions, the main chuck 17 can be driven to move practically along the ideal track by using the technique of driving the main chuck 17 stepwise according to the invention. Hence, the main chuck 17 is driven excessively almost along an ideal track to ensure that each of the probes 24A is moved within the corresponding electrode pad to allow a probe-test to be performed highly reliably. In practical applications, the main chuck 17 is preferably driven excessively in four or more than four strokes.

Now, a probe-test method according to the invention will be described in terms of the operation of the embodiment of prober. Prior to testing a wafer W, wafer information and card information will be entered to the controller 13 by way of the input device 25. The input data will be visually confirmed on the screen of the display 14 and stored in the first memory 131. Since the main chuck information comprises fixed data, it is accessed and stored in the second memory 132 in advance. The wafer W is pre-aligned in the loader chamber and fed onto the main chuck 17 in the prober chamber 12. In the prober chamber 12, the wafer W is aligned with the probes and the IC chips formed on the wafer W are sequentially examined for certain electric characteristics.

In the course of sequentially examining the electric characteristics of the IC chips on the wafer W, the CPU 133 reads the program on the probe-test method of the invention out of the second memory 132.

Figure 5:
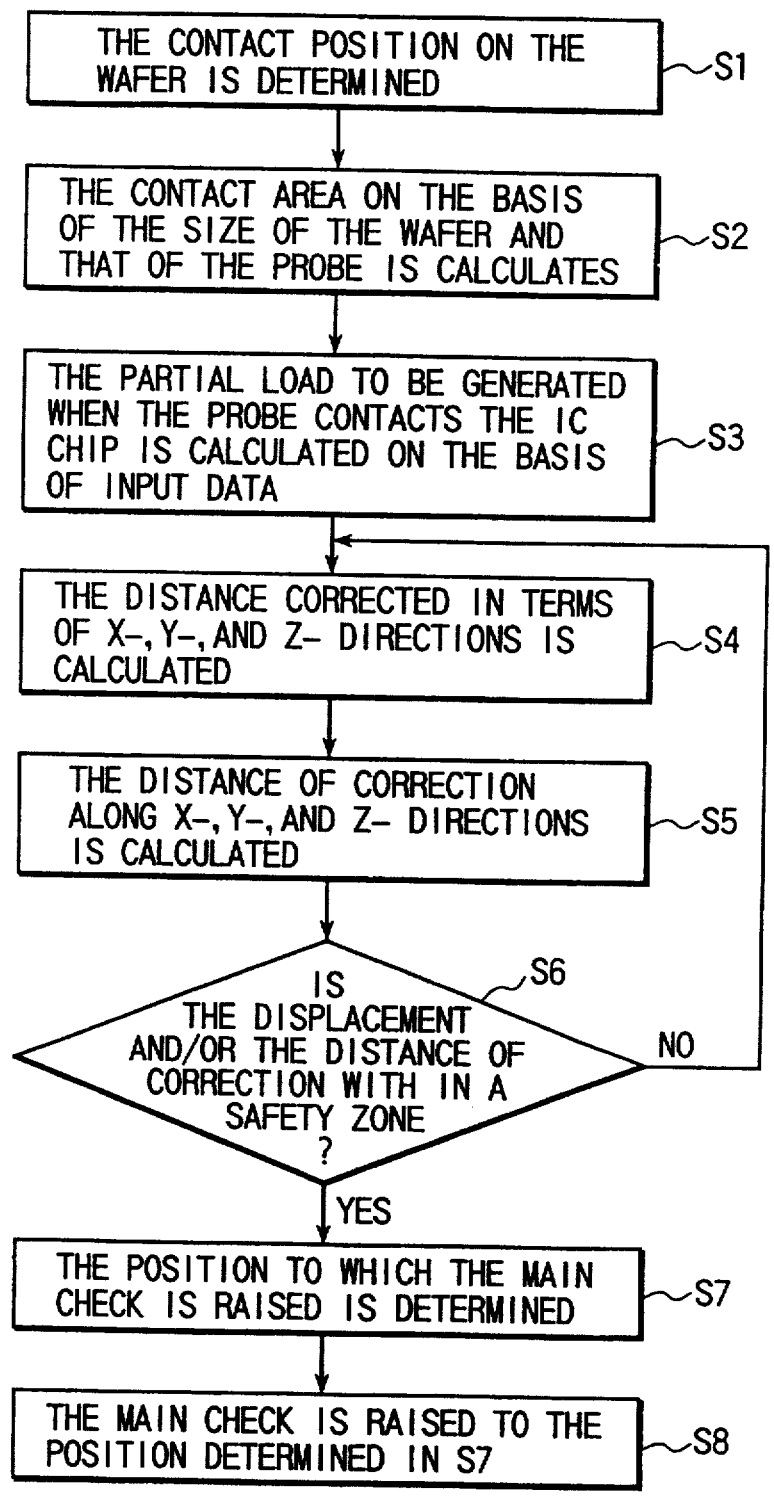
FIG. 5 is a flow chart of an operation of correcting the displacement of the main chuck to be conducted by means of the controller of FIG. 1.
Figure 6:
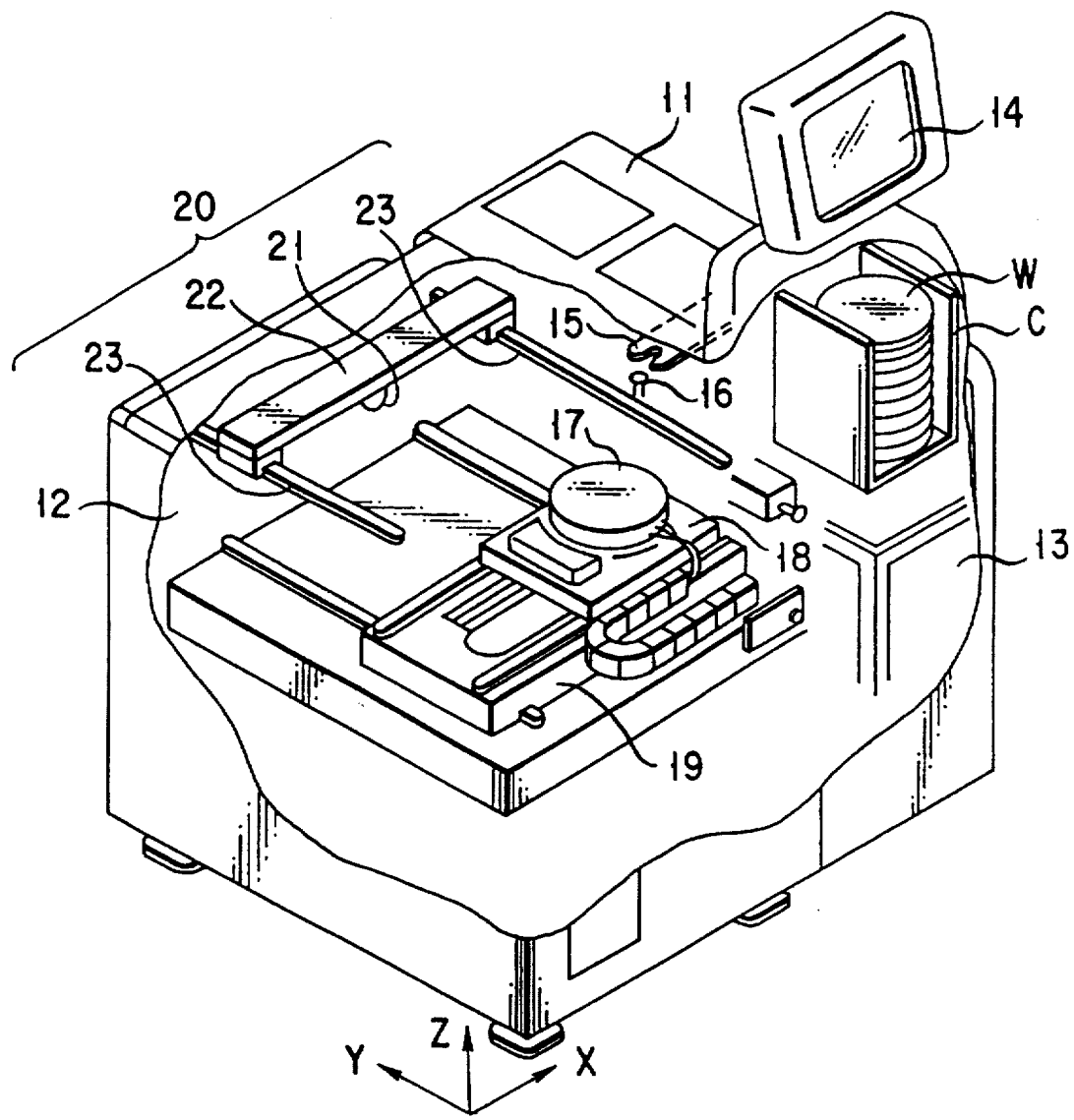
FIG. 6 is a partially cut-out schematic perspective view of a known prober.
Figure 7A:
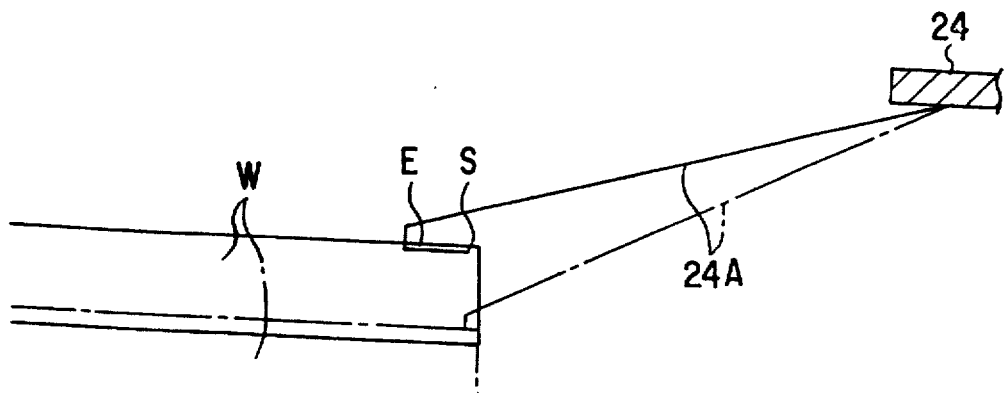
FIG. 7A an enlarged schematic partial side view of the main chuck of a known prober with a relatively small number of probes, illustrating the positional relationship between the main chuck and one of the probes of the prober.
Figure 7B:
FIG. 7B is a schematic plan view of an electrode pad of a wafer W placed in the prober of FIG. 8A, illustrating how the corresponding probe is moved.
Figure 8A:
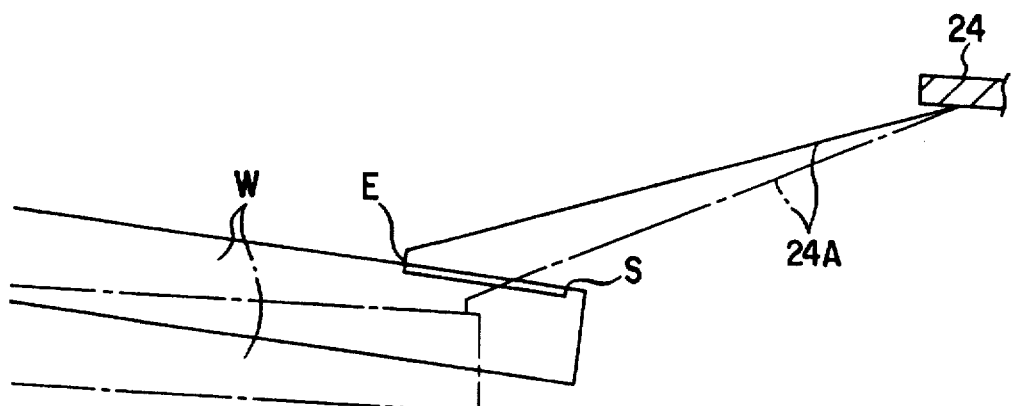
FIG. 8A an enlarged schematic partial side view of the main chuck of a known prober with a relatively large number of probes, illustrating the positional relationship between the main chuck and one of the probes of the prober.
Figure 8B:
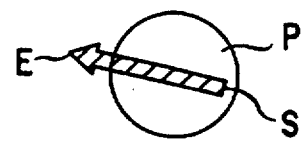
FIG. 8B is a schematic plan view of an electrode pad of a wafer W placed in the prober of FIG. 8A, illustrating how the corresponding probe is moved.

For example, the main chuck 17 is driven excessively, taking the distance of correction into consideration and preferably according to the flow chart of FIG. 5. Referring to FIG. 5, firstly, the location of the IC chip to be examined firstly or the position where the corresponding one of the probes 24A contacts it for the first time is determined (S1). The subsequent contact positions are determined by the CPU 133 according to a predetermined indexing order.

Then, the CPU 133 reads the wafer information and the card information stored in the first memory 131. The first arithmetic operation unit 133A calculates the contact area on the basis of the size of the wafer W and that of the probe 24A (S2).

The first arithmetic operation unit 133A then calculates the partial load to be generated when the probe 24A contacts the IC chip from the data (S3).

The CPU 133 then reads the main chuck information stored in the second memory 132 and the first arithmetic operation unit 133A calculates the distance by which the position of the main chuck 17 is corrected in terms of the X-, Y- and Z-directions (S4).

Then, the second arithmetic operation unit 133B calculates the distance of correction for correcting the position of the main chuck 17 along the X-, Y- and Z-directions in order to reduce the displacement (S5).

The determining unit 133C determines if the displacement and/or the distance of correction are found within a safety zone (S6). A technique for determining if the displacement and/or the distance of correction are found within a safety zone may be selecting a given area for the safety zone. If it is determined that the displacement and/or the distance of correction are not found within the safety zone, the processing operation returns to S4 and Steps S4 through S6 are repeated until the displacement and/or the distance of correction are found within the safety zone. In the course of the repeated processing operation, the data entered initially may be modified, if partly. Once the displacement and/or the distance of correction are found within the safety zone, the position to which the main chuck is raised is determined on the basis of the distance of correction (S7).

Then, the main chuck is raised to the position determined in S7 and the electrodes of the wafer W arranged on the main chuck are brought into contact with the respective probes (S8). The rising motion of the main chuck can be conducted in a plurality of strokes (e.g., 4 strokes). Thus, for each and every one of the chips arranged on the wafer W, the corresponding one of the probes 24A is reliably brought into contact with the electrode pad P of the chip (FIG. 3) so that the chip can be examined correctly for certain electric characteristics.

Now, a specific technique for determining the distance of correction in these steps will be described below.

Firstly, the following basic parameters will be obtained by calculation on the basis of various input data.

(1) contact pressure per probe $P(gr)$
(2) distance by which main chuck is driven excessively at the time of measuring the contact pressure $Z(\mu m)$
(3) total number of probes n
(4) ratio of probes contacting respective electrodes of IC chip to all probes $a(\%)$
(5) distance by which main chuck is driven excessively during prober operation ($OD\ (\mu m)$)

Figure 9A:
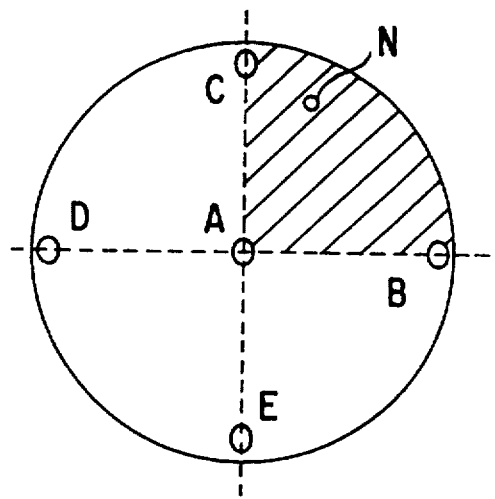
FIG. 9A is a graph showing how the main chuck of a prober is displaced when it is subjected to a load.

As the above parameters are defined, weight W to be applied to the five spots on the main chuck shown in FIG. 9A is determined by means of equation (1) below.

$$W(kgf) = n \times (P/1000) \times (OD/Z) \times (a/100) \quad (1)$$

As the weight W is applied to the five spots shown in FIG. 9A, a strain appears at each of the spots. The strains will be expressed by vectors $A(x,y,z), \ldots, E(x,y,z)$ respectively and determined by means of a dedicated jig for each prober table.

Figure 9B:
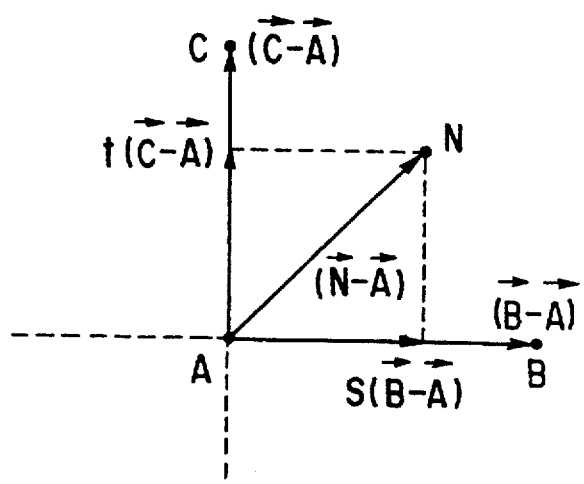
FIG. 9B is a graph illustrating vectors of strain.

Now, strain vector $N(x,y,z)$ at any spot in the shaded area in FIG. 9A can be expressed in terms of strain vectors $A(x,y,z)$, $B(x,y,z)$ and $C(x,y,z)$ as follows.

$$(\vec{N}-\vec{A}) = s(\vec{B}-\vec{A}) + t(\vec{C}-\vec{A})$$

where s and t are parameters for indicating that the vector is a vector that can be obtained at any spot (in the shaded area in FIG. 9A). In other words, referring to FIG. 9B, the above equation says that $(\vec{N}-\vec{A})$ is a composite vector obtained by multiplying $(\vec{B}-\vec{A})$ by parameter s (0<s<1) and multiplying $(\vec{C}-\vec{A})$ by parameter t (0<t<1).

Thus, the strain vector N at any spot can be obtained by equation (2) below.

$$\vec{N} = s(\vec{B}-\vec{A}) + t(\vec{C}-\vec{A}) + \vec{A} \quad (2)$$

where s and t are parameters (0<s<1, 0<t<1).

Since N represents strain that appears when weight M(kgf) is applied, the strained distance σ at the position where a probe contacts the corresponding IC chip can be obtained by means of equation (3) below, using the weight W that appears at the time of contact and is obtained by equation (1) above.

$$\vec{\sigma} = \frac{W}{M}\{s(\vec{B}-\vec{A}) + t(\vec{C}-\vec{A}) + \vec{A}\} \quad (3)$$

Similarly, the strained distance at any other position can be obtained in the same manner.

Thus, with the above described embodiment of the invention, the displacement of the tip of each of the probes relative to the corresponding electrode pad on the IC chip that appears when the main chuck is driven excessively can be corrected for each wafer and for each IC chip if wafers W show a large diameter and a large number of probes are arranged on a probe card 24. Particularly, the displacement of the tip of each of the probes due to a tilted main chuck can be corrected by means of a partial weight as described above. As a result, each and every IC chip can be examined reliably for certain electric characteristics.

With the above described embodiment, the distance by which the main chuck is driven toward the probes excessively is divided into four strokes so that the main chuck is driven stepwise to practically follow an ideal track for the main chuck 17. Thus, each of the probes 24A can reliably be brought into contact with the corresponding one of the electrode pads of the IC chip arranged on the wafer W. More specifically, as the main chuck 17 is driven excessively in terms of X-, Y- and Z-directions, the displacement of the main chuck 17 is decomposed into components along those directions and the main chuck 17 is driven stepwise in each of these directions so that the main chuck 17 can be accurately and reliably driven toward the probes excessively if the X-, Y- and Z-directions show different respective resolutions for the main chuck 17.

The present invention is not limited to the above described embodiment in any sense of the word. Any probe-test method adapted to calculate the displacement of the tip of each of the probes on the basis of various data and drive the main chuck excessively, while correcting the motion of the main chuck, will fall within the scope of the present invention.

Particularly, any probe-test method with which, when the main chuck is inclined and the tips of the probes are displaced due to a partial weight that is applied in a manner as described above, the main chuck 17 is driven toward the probes excessively not only in the Z-direction but also in the X- and Y-directions by a distance determined on the basis of various data depending on the inclination will falls within the scope of the present invention.

The object of examination is an IC chip formed on a semiconductor wafer in the case of the above described embodiment. However, the present invention may be embodied differently. For example, any electronic elements that can be tested by probes for certain electric characteristics provide objects of examination for a probe-test method and a prober according to the invention.

While needle-like probes are used in the above embodiment, probes in any other form may be used for the purpose of the invention. For example, bump-like probes may also be used for the purpose of the invention.

The step of raising the main chuck toward the probes and causing the object of examination to contact with the probes in the above described mode of carrying out the invention is divided into two sub-steps of raising the main chuck until the object of examination contacts or comes close to the probes and driving the main chuck excessively further toward the probes. However, the step may be carried out differently. For example, it may be realized in a single step where the main chuck is raised toward the probes until the object of examination and the probes are put to a certain state of mutual contact.

The data for predicting the displacement of certain spots on the main chuck to be brought into contact with the respective probes in terms of X-, Y- and Z-directions include data relating to the main chuck, those relating to the object of examination and those relating to the probes in the above embodiment and used for equations (1), (2) and (3) as cited above. However, it will be appreciated that other techniques may alternatively be used for predicting the displacement by appropriately using other sets of data for the purpose of the invention.

For the purpose of the invention, the distance of correction preferably has a value that makes the displacement equal to zero. However, the distance of correction does not necessarily have to make the displacement equal to zero for the purpose of the invention. In other words, the distance of correction preferably has a value that minimize the displacement so that the probes may reliably come into contact with the respective electrodes on the object of examination.

The main chuck is raised to a position determined by taking the distance of correction into consideration in the above described embodiment. However, the operation of raising the main chuck may be conducted differently for the purpose of the invention. For instance, it may be raised to a predetermined position without considering the distance of correction and then the main chuck may be positionally corrected on the basis of the distance of correction.

For the purpose of the invention, the operation of determining the feasibility of at least either the displacement or the distance of correction may be performed by determining the feasibility of the various data entered to determine the distances or by determining if the distances are found within a range adapted for correction by moving the main chuck.

For the purpose of the invention, the operation of moving the main chuck along each of the X-, Y- and Z-directions in one or more than one strokes may be carried out in various different modes. For example, the operation may be started with any of the X-, Y- and Z-directions. Alternatively, the operation may be conducted firstly by raising the main chuck in one of the X-, Y- and Z-directions to a predetermined position and then moving it stepwise in the remaining directions. Still alternatively, the operation may be conducted in a first step of raising the main chuck simultaneously in all of the X-, Y- and Z-directions and then in a second step of raising it sequentially in the X-, Y- and Z-directions.

The above described system used for the controller of the above embodiment may be realized by means of circuits or by means of microprocessors that operate under the control of software.

Additional advantages and modifications will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents.

What is claimed is:

1. A probe-test method comprising steps of:
   placing an object of examination on a main chuck adapted to move along X-, Y-, Z- and θ-directions;
   aligning the main chuck with probes held to respective locations above the main chuck;
   raising the main chuck toward the probes to make the object contact with the probes, and overdriving the main chuck, to thereby completely effect electric conduction between the object and the probes; and
   examining the object to determine certain electric characteristics thereof;
   characterized by further comprising steps of:
   predicting the displacement of each of the positions on the object to be brought into contact with the corresponding one of the probes, which occurs in the X-, Y- and Z-directions due to the tilt of the main chuck caused by overdriving the object on the main chuck for the probes, on the basis of given data;
   determining by arithmetic operation the distance for the position to be corrected at least in one of the X-, Y- and Z-directions in order to reduce the predicted displacement; and
   determining the position for the main chuck to be overdriven according to the distance of correction.

2. A probe-test method according to claim 1, further comprising a step of:
   determining the feasibility of at least one of the displacement and the distance of correction.

3. A probe-test method according to claim 1, wherein said given data comprises data relating to the main chuck, those relating to the object of examination and those relating to the probes.

4. A probe-test method comprising steps of:
   placing an object of examination on a main chuck adapted to move along X-, Y-, Z- and θ-directions;
   aligning the main chuck with probes held to respective locations above the main chuck;
   raising the main chuck toward the probes, and overdriving the main chuck, to thereby complete effect electric conduction between the object and the probes; and
   examining the object to determine certain electric characteristics thereof;
   characterized by further comprising steps of:
   predicting the displacement of each of the positions on the object to be brought into contact with the corresponding one of the probes, which occurs in the X-, Y- and Z-directions due to the tilt of the main chuck caused by overdriving the object on the main chuck with the probes, on the basis of given data;
   determining by arithmetic operation the distance for the position to be corrected at least in one of the X-, Y- and Z-directions in order to reduce the predicted displacement;
   determining the position for the main chuck to be overdriven, according to the distance of correction; and
   overdriving the main chuck to the determined position in a plurality of raising steps.

5. A probe-test method according to claim 4, further comprising a step of:
   determining the feasibility of at least one of the displacement and the distance of correction.

6. A probe-test method according to claim 4, characterized in that said main chuck is raised in each of the X-, Y- and Z-direction, at least in one step.

7. A prober comprising:
   a prober chamber;
   a plurality of probes held to an upper portion of the prober chamber;
   a main chuck arranged below the probes for carrying thereon an object of examination movable in X-, Y-, Z- and θ-directions; and
   a controller for controlling the movement of the main chuck to align the probes and the object and raise the object in order to make it contact with the probes, and overdriving the main chuck, to thereby completely effect electric conduction between the object and the probes;
   characterized in that said controller comprises a system adapted to overdrive the main chuck in order to completely effect electric conduction between the object and the probes by:
   predicting the displacement of each of the positions on the object to be brought into contact with the corresponding one of the probes, which occurs in the X-, Y- and Z-directions due to the tilt of the main chuck caused by the contact of the object on the main chuck with the probes on the basis of given data;
   determining by arithmetic operation the distance for the position to be corrected at least in one of the X-, Y- and Z-directions in order to reduce the predicted displacement; and
   determining the position for the main chuck to be overdriven, according to the distance of correction.

8. A prober according to claim 7, wherein said system comprises:
   a memory for storing data relating to the main chuck, those relating to the object of examination and those relating to the probes;
   a first operation unit for arithmetically determining the displacement according to the data stored in the memory;
   a second operation unit for arithmetically determining the distance for the position to be corrected at least in one of the X-, Y- and Z-directions in order to reduce the displacement according to the outcome of the operation of the first operation unit; and
   determining unit for determining the feasibility of at least one of the outcome of the arithmetic operation of the first operation unit and that of the second operation unit.

9. A prober according to claim 7, wherein said controller comprises:
   a determining unit for determining the feasibility of at least one of the outcome of the arithmetic operation of the first operation unit and that of the second operation unit.

10. A prober comprising:
    a prober chamber;
    a plurality of probes held to an upper portion of the prober chamber;

a main chuck arranged below the probes for carrying thereon an object of examination movable in X-, Y-, Z- and θ-directions; and a controller for controlling the movement of the main chuck to align the probes and the object and raise the object in order to make it contact with the probes, and overdriving the main chuck to completely effect electric conduction between the object and the probes;

characterized in that said controller comprises a system adapted to raise the main chuck in order to make the object contact with the probes by:

predicting the displacement of each of the positions on the object to be brought into contact with the corresponding one of the probes in the X-, Y- and Z-directions due to the tilt of the main chuck caused by the contact of the object on the main chuck with the probes on the basis of given data;

determining by arithmetic operation the distance for the position to be corrected at least in one of the X-, Y- and Z-directions in order to reduce the predicted displacement;

determining the position for the main chuck to be raised to according to the distance of correction; and overdriving the main chuck to the determined position in a plurality of raising steps.

11. A prober according to claim 10, characterized in that said main chuck is raised in each of the X-, Y- and Z-direction, at least in one step.

12. A prober according to claim 10, wherein said system controller comprises:

a memory for storing data relating to the main chuck, those relating to the object of examination and those relating to the probes;

a first operation unit for arithmetically determining the displacement according to the data stored in the memory;

a second operation unit for arithmetically determining the distance for the position to be corrected at least in one of the X-, Y- and Z-directions in order to reduce the displacement according to the outcome of the operation of the first operation unit; and determining unit for determining the feasibility of at least one of the outcome of the arithmetic operation of the first operation unit and that of the second operation unit.

* * * * *